US012726195B2

(12) United States Patent
Zhu

(10) Patent No.: US 12,726,195 B2
(45) Date of Patent: Sep. 1, 2026

(54) POWER SWITCHING DEVICE OPERABLE TO REDUCE ON- RESISTANCE AND EXTEND SHORT CIRCUIT WITHSTAND TIME

(71) Applicant: SEMICONDUCTOR COMPONENTS INDUSTRIES, LLC, Scottsdale, AZ (US)

(72) Inventor: Ke Zhu, Princeton, NJ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 19/083,893

(22) Filed: Mar. 19, 2025

(65) Prior Publication Data

US 2025/0317138 A1 Oct. 9, 2025

Related U.S. Application Data

(60) Provisional application No. 63/574,951, filed on Apr. 5, 2024.

(51) Int. Cl.

*H02M 1/08* (2006.01)
*H03K 17/082* (2006.01)
*H03K 17/12* (2006.01)
*H03K 17/687* (2006.01)

(52) U.S. Cl.

CPC ............ *H03K 17/122* (2013.01); *H02M 1/08* (2013.01); *H03K 17/0822* (2013.01); *H03K 17/6871* (2013.01); *H03K 2017/6875* (2013.01)

(58) Field of Classification Search

CPC ... H02M 1/08; H03K 17/0822; H03K 17/122; H03K 17/6871; H03K 2017/6875

USPC ........................................ 327/108, 109, 379

See application file for complete search history.

(56) References Cited

U.S. PATENT DOCUMENTS

| | | | | |
|---|---|---|---|---|
| 8,508,258 | B2 | 8/2013 | Ishikawa | |
| 8,558,587 | B2 | 10/2013 | Machida | |
| 8,729,566 | B2 * | 5/2014 | Domes | H03K 17/063 257/77 |
| 8,773,172 | B2 | 7/2014 | Bayerer | |
| 8,958,193 | B2 | 2/2015 | Veliadis | |

(Continued)

FOREIGN PATENT DOCUMENTS

| | | | |
|---|---|---|---|
| EP | 3472905 | B1 | 9/2020 |
| JP | 6009932 | B2 | 7/2014 |

(Continued)

OTHER PUBLICATIONS

Analog Devices: Data Sheet—ADuM4136, Single-/Dual-Supply, High Voltage Isolated IGBT Gate Driver, 2016, 16 pages.

*Primary Examiner* — William Hernandez

(74) *Attorney, Agent, or Firm* — Slayden Grubert Beard PLLC

(57) ABSTRACT

A power switching device is disclosed. The power switching device includes a cascode switching circuit comprising a normally-on transistor and a normally-off transistor provided in a cascode topology. The power switching device also includes a gate driver circuit configured to apply a positive bias voltage at a respective gate terminal of the normally-on transistor under a normal operating condition, and to apply a negative bias voltage at the respective gate terminal of the normally-on transistor under a short circuit condition.

20 Claims, 7 Drawing Sheets

(56) References Cited

U.S. PATENT DOCUMENTS

| | | | | |
|---|---|---|---|---|
| 9,019,001 | B2 | 4/2015 | Kelley | |
| 9,590,609 | B1 | 3/2017 | Osman | |
| 2011/0102054 | A1* | 5/2011 | Domes | H03K 17/567 327/419 |
| 2012/0133397 | A1* | 5/2012 | Draxelmayr | H03K 17/063 327/109 |
| 2015/0171750 | A1* | 6/2015 | Zeng | H02M 1/08 323/311 |
| 2016/0065064 | A1* | 3/2016 | Zojer | H03K 17/107 323/271 |
| 2016/0065203 | A1* | 3/2016 | Zojer | H03K 17/6871 327/109 |
| 2016/0094218 | A1* | 3/2016 | Van Otten | H03K 17/6871 327/427 |
| 2017/0047841 | A1* | 2/2017 | Zojer | H03K 17/567 |
| 2025/0174976 | A1* | 5/2025 | Han | H02H 7/20 |

FOREIGN PATENT DOCUMENTS

| | | | |
|---|---|---|---|
| JP | 2016131465 | A | 7/2016 |
| WO | 2004070780 | A2 | 8/2004 |
| WO | 2013011288 | A2 | 1/2013 |
| WO | 2023081503 | A1 | 5/2023 |

* cited by examiner

POWER SWITCHING DEVICE OPERABLE TO REDUCE ON- RESISTANCE AND EXTEND SHORT CIRCUIT WITHSTAND TIME

This application claims the benefit of provisional patent application No. 63/574,951, filed Apr. 5, 2024, which is hereby incorporated by reference herein in its entirety.

FIELD OF THE DISCLOSURE

The technology of the disclosure relates generally to power electronics, and specifically to power switching devices in electronic power systems.

BACKGROUND

Electronic power systems promote conversion and distribution of electrical power from a power source to electronics and electrical machines. A power conversion circuit is often at the heart of each electronic power system and may be configured to convert electrical power from a raw unregulated form and quantity as produced by the power source to an appropriate regulated form and quantity as needed by machines, motors, and/or other electronic equipment.

DC-DC power conversion may be performed by switch-mode power supplies that operate by toggling a main switch between an ON-state (also referred to as a closed state or a conductive state) and an OFF-state (also referred to as an open state or a non-conductive state). More specifically, the DC-DC conversion can be carried out by a buck converter (also referred to as a step-down converter) or a boost converter (also referred to as a step-up converter). The buck converter may pass energy directly to an output with an energy storage inductor providing continuing current to the output when the main switch is in the OFF-state, whereas the boost converter may store the output energy in an inductor when the main switch is in an ON-state and pass the stored energy to the output when the main switch is in the OFF-state.

Cascoded switches may be used as the power switch in power conversion systems to drive high currents and to withstand large voltages. Inventors of embodiments of the present disclosure have recognized that lowering the ON-state resistance of a cascoded switch for a given application typically comes at the expense of larger die size and increased cost. The inventor of embodiments of the present disclosure has also recognized certain power converter applications, the power switches utilized therein may be required to survive a short circuit condition for a given short circuit withstand time (SCWT). Embodiments of the present disclosure may address one or more of these challenges.

SUMMARY

Aspects disclosed in the detailed description are related to a power switching device operable to reduce on-resistance and extend short circuit withstand time (SCWT). The power switching device may include a cascode switching circuit wherein a normally-on transistor, such as a silicon carbide (SiC) junction field-effect transistor (JFET), and a normally-off transistor, such as a silicon (Si) metal-oxide-semiconductor field-effect transistor (MOSFET), are configured according to a cascode topology. In embodiments disclosed herein, the gate-to-source voltage of the normally-on transistor may be positively biased to reduce on-resistance under a normal operating condition (for example in the absence of a short circuit condition). The gate-to-source voltage of the normally-on transistor may also be negatively biased in response to a detected short circuit condition to extend the short circuit withstand time of the power switching device under a short circuit condition. As a result, the power switching device can achieve lower conduction loss and higher efficiency under the normal operating condition and also reduce false alarms under short circuit conditions.

In one aspect, a power switching device is provided. The power switching device may include a cascode switching circuit. The cascode switching circuit may include a normally-on transistor and a normally-off transistor provided in a cascode topology. The power switching device also includes a gate driver circuit. The gate driver circuit may be configured to apply a positive bias voltage at a respective gate terminal of the normally-on transistor under a normal operating condition (for example in the absence of a short circuit condition) to thereby reduce an on-resistance of the normally-on transistor. The gate driver circuit may also be configured to apply a negative bias voltage at the respective gate terminal of the normally-on transistor under a short circuit condition to thereby extend a short circuit withstand time (SCWT) of the normally-on transistor and of the power switching device as a whole.

In another aspect, an electronic power system is provided. The electronic power system includes a conversion circuit. The conversion circuit may be coupled between a power source and a load circuit. The conversion circuit may include one or more power switching devices, which may include a cascode switching circuit. The cascode switching circuit may include a normally-on transistor and a normally-off transistor provided in a cascode topology. The power switching device may also include a gate driver circuit. The gate driver circuit may be configured to apply a positive bias voltage at a respective gate terminal of the normally-on transistor under a normal operating condition (for example in the absence of a short circuit condition) to thereby reduce an on-resistance of the normally-on transistor. The gate driver circuit may also be configured to apply a negative bias voltage at the respective gate terminal of the normally-on transistor under a short circuit condition to thereby extend a short circuit withstand time (SCWT) of the normally-on transistor and of the power switching device as a whole.

In another aspect, a method for operating a power switching device comprising a normally-on transistor and a normally-off transistor configured in a cascode topology is provided. The method may include applying a positive bias voltage at a respective gate terminal of a normally-on transistor under a normal operating condition (for example in an absence of a short circuit condition) to thereby reduce an on-resistance of the normally-on transistor. The method may also include applying a negative bias voltage at the respective gate terminal of the normally-on transistor under a short circuit condition to thereby extend a SCWT of the normally-on transistor.

Those skilled in the art will appreciate the scope of the disclosure and realize additional aspects thereof after reading the following detailed description in association with the accompanying drawings.

BRIEF DESCRIPTION OF THE DRAWINGS

A more complete understanding of the present embodiments may be acquired by referring to the following description taken in conjunction with the accompanying drawings, in which like reference numbers indicate like features.

DETAILED DESCRIPTION

Details of one or more embodiments are set forth in the description below and the accompanying drawings. Other features will be apparent from the description, drawings, and from the claims. The embodiments disclosed should not be interpreted, or otherwise used, as limiting the scope of the disclosure, including the claims. In addition, one skilled in the art understands that the following description has broad application, and the discussion of any embodiment is meant to be exemplary of that embodiment, and not intended to intimate that the scope of the disclosure, including the claims, is limited to that embodiment.

Various terms are used to refer to particular system components. Different companies may refer to a component by different names, and this disclosure does not intend to distinguish between components that differ in name but not form and function. In the following description and in the claims, the terms "including" and "comprising" are used in an open-ended fashion, and thus should be interpreted to mean "including, but not limited to." Also, the term "couple" or "coupled" is intended to mean either an indirect or direct connection. Thus, if a first device couples to, or is coupled to, a second device, that connection between the first device and the second device may be through a direct connection or through an indirect connection via other elements and connections.

Further, although the terms "first," "second," and so forth may be used herein to describe various elements, these elements should not be limited by these terms. Terms such as "first" and "second" may be used merely to distinguish one element from another. For example, a first element could be termed a second element, and, similarly, a second element could be termed a first element, without departing from the scope of the present disclosure. Further, the identification of a "first" element, does not necessarily require the presence of a "second" element. As used herein, the term "and/or" includes any and all combinations of one or more of the associated listed items.

FIGS. 1A-1D illustrate schematic diagrams of a boost converter 10 in accordance with embodiments of the present disclosure. Boost converter 10 is an example of a power conversion system that may be prone to damage under a short circuit condition.

Figure 1A:
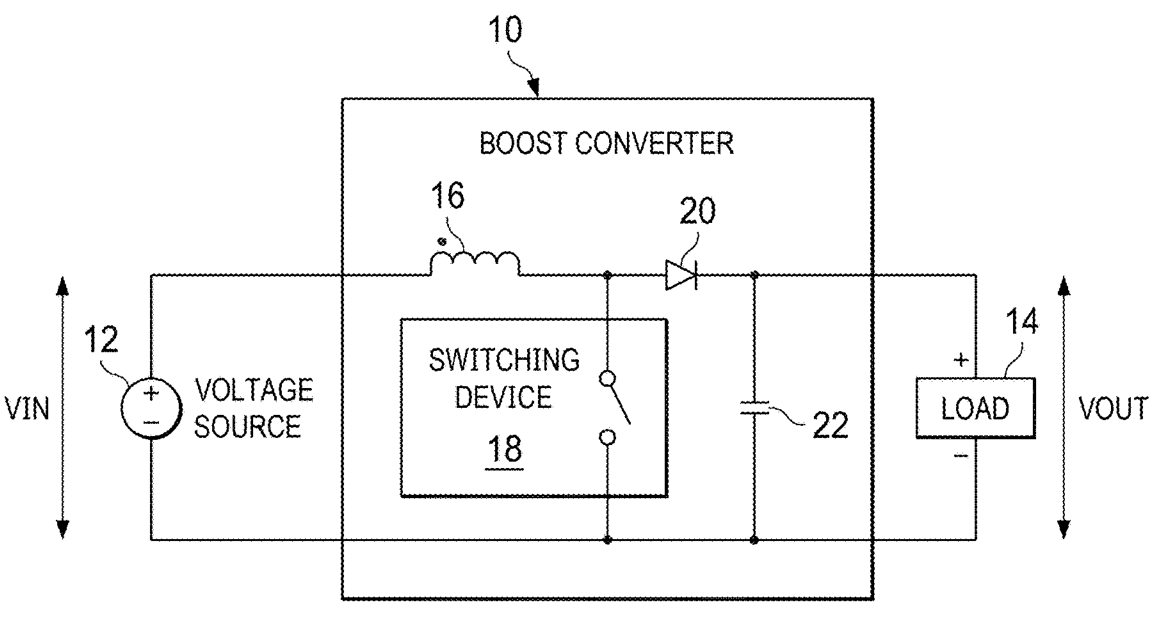
FIGS. 1A-1D illustrate schematic diagrams of an boost converter in accordance with embodiments of the present disclosure.

As shown in FIG. 1A, boost converter 10 may be coupled between a voltage source 12 and a load 14. Boost converter 10 may include for example an inductor 16, a switching device 18, a diode 20, and a capacitor 22. As also shown in FIG. 1A, the inductor 16 and diode 20 may be coupled in series between a positive terminal of the voltage source 12 and the positive terminal of the load 14 at the output of boost converter 10. The switching device 18, which may be for example a semiconductor switch such as a MOSFET, may be coupled between the negative terminal of the voltage source 12 and the intermediate node that is between the inductor 16 and the diode 20. Further, the capacitor 22 may be coupled across the output of boost converter 10 to store charge and to help hold the output voltage $V_{OUT}$ of boost converter 10 at or near a desired value. During operation, boost converter 10 may convert or boost a lower input voltage $V_{IN}$ from the voltage source 12 to into a higher output voltage $V_{OUT}$ ($V_{OUT}>V_{IN}$) to be provided to the load 14 at the output of boost converter 10.

Figure 1B:
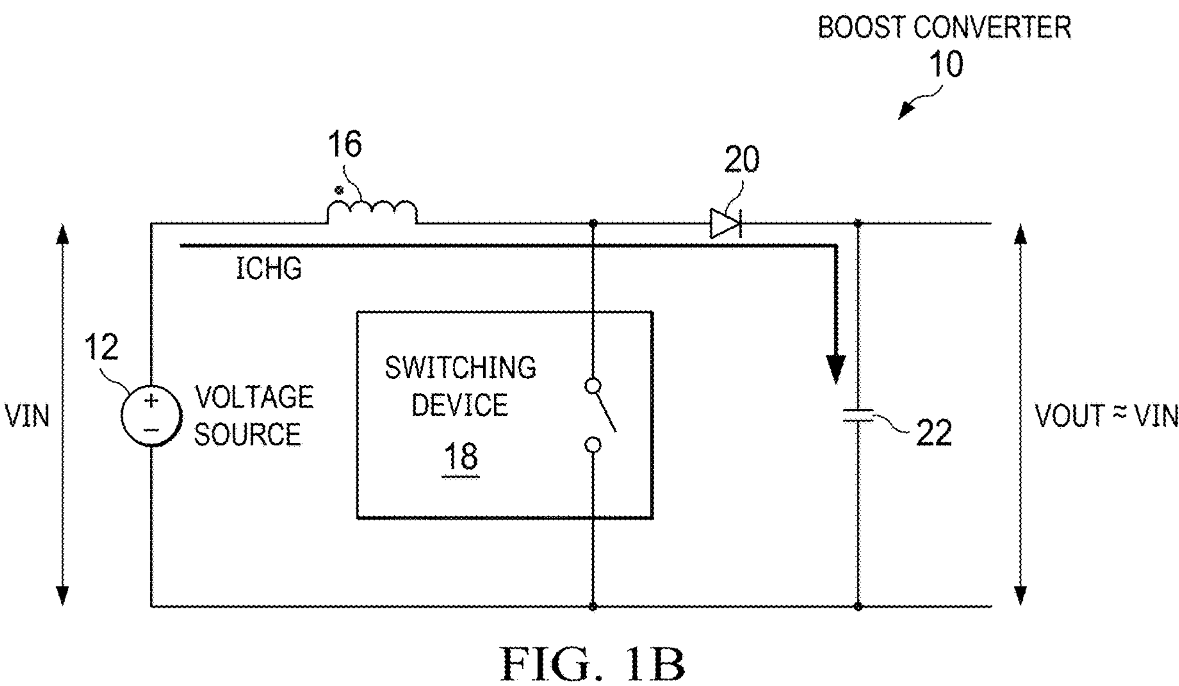

FIG. 1B illustrates an initial switching condition of boost converter 10 whereby the switching device 18 is in an open state (also referred to as an OFF-state or a non-conductive state). A charging current ICHG may flow through the inductor 16 and diode 20 to the output of boost converter 10 so long as diode 20 is forward biased. Thus, during the initial state shown in FIG. 1B, the charging current ICHG may charge capacitor 22 to an output voltage $V_{OUT}$ value that is approximately equal to the input voltage $V_{IN}$ (not accounting for the forward-bias voltage drop across the diode 20).

Figure 1C:
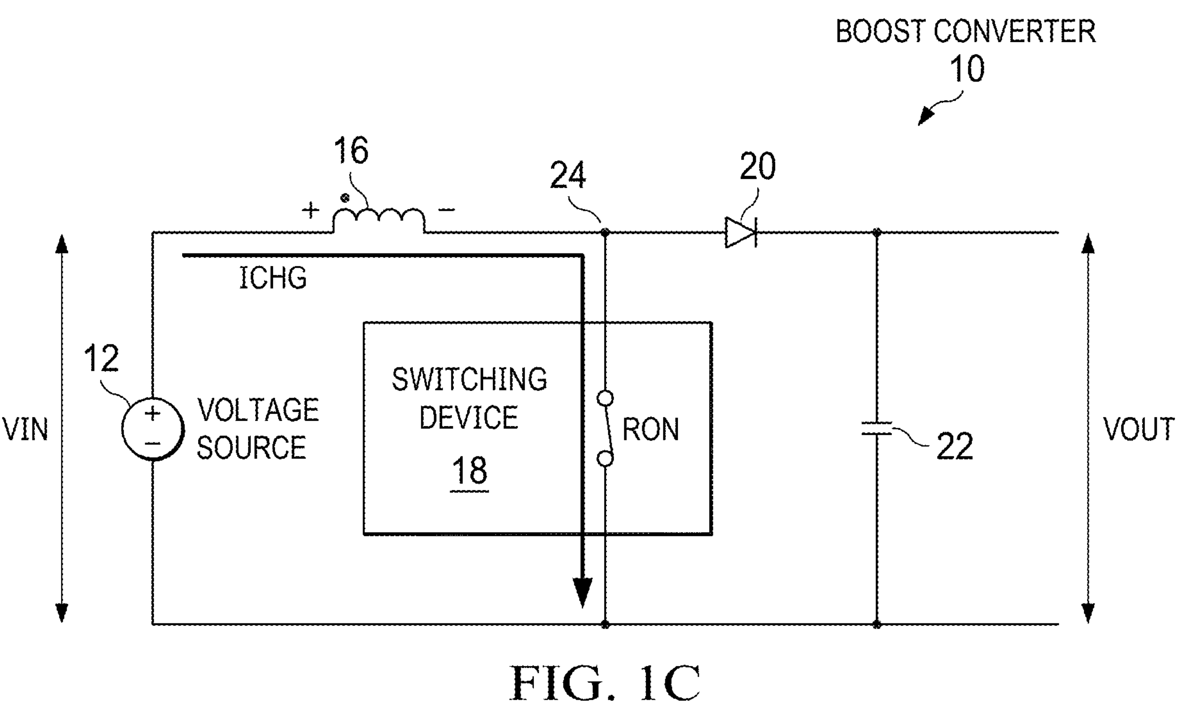

FIG. 1C illustrates a subsequent switching condition of boost converter 10 whereby the switching device is in a closed state (also referred to as an ON-state or a conductive state). During this state, diode 20 may be reverse biased and capacitor 22 may maintain the output voltage $V_{OUT}$ at the output of boost converter 10. Meanwhile, the charging current ICHG may be diverted through switching device 18. The charging current ICHG may grow at a rate proportional to the input voltage $V_{IN}$ applied by voltage source 12 across the inductor 16, thereby building a magnetic field around the inductor 16. Because the switching device 18 can be implemented by, for example, a MOSFET, the switching device 18 may present an on-resistance RON when the switching device 18 is in the ON-state. In some applications, a lower on-resistance RON may be preferable to reduce conduction loss that are proportional to the on-resistance RON and thereby increase the efficiency of boost converter 10. Such lower on-resistance RON may typically come at the expense however of slower switching speeds, higher costs in raw material (larger die size is required to reduce the on-resistance RON), and lower yields per wafer for a given defect rate in production as a by-product of the larger die size having a larger chance of capturing such a defect.

Figure 1D:
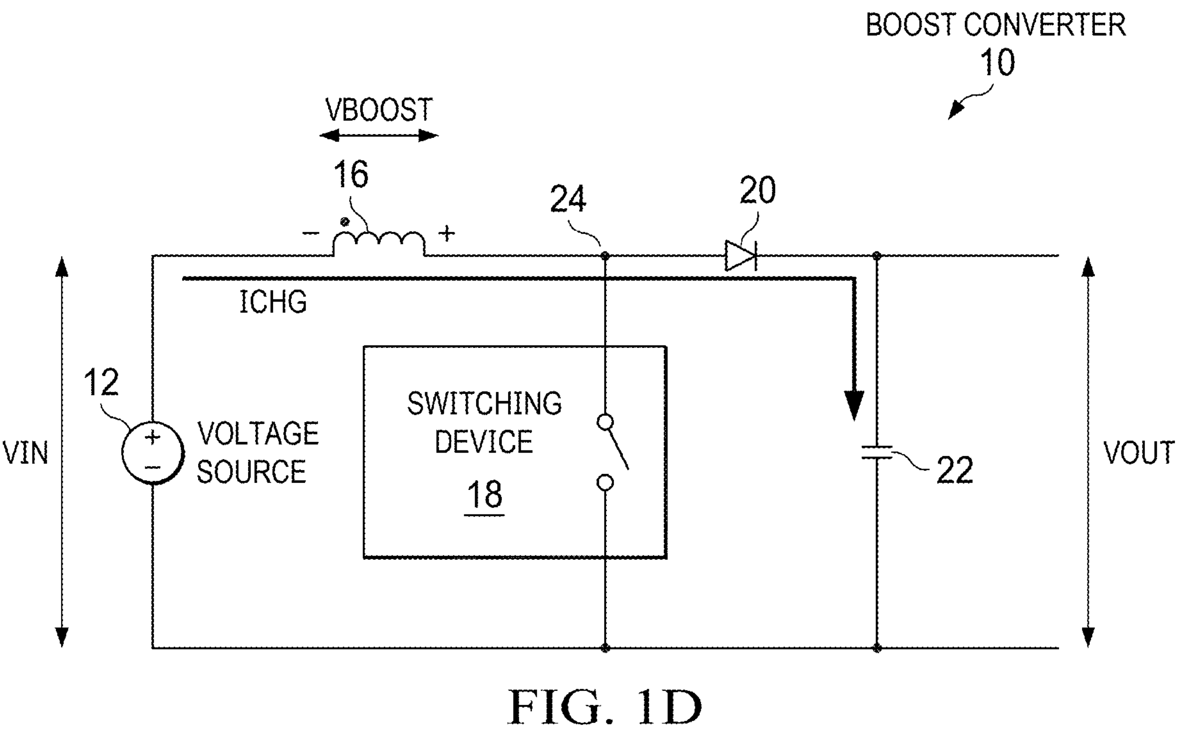

FIG. 1D illustrates a further switching condition whereby the switching device 18 is again toggled to the open state (OFF-state). When the switching device 18 changes from the closed state (ON-state) to the open state (OFF-state), the inductor 16 may maintain the instantaneous value of the charging current ICHG. The voltage at node 24 may thus increase to forward bias diode 20. The charging current ICHG may accordingly pass through diode 20 and charge the capacitor 22 to an output voltage $V_{OUT}$ value higher than the input voltage $V_{IN}$. The charging current ICHG through the inductor 16 may decrease at a rate roughly proportional to the output voltage $V_{OUT}$ minus the input voltage $V_{IN}$ (not accounting for additional voltage loss across the diode 20) as the previously accumulated magnetic energy in the inductor 16 releases. During subsequent operation, the switching device 18 may repeatedly cycle between the closed state (ON-state) illustrated in FIG. 1C and the open state (OFF-state) illustrated in FIG. 1D to provide power to the load 14 at an output voltage $V_{OUT}$ level greater than the input voltage $V_{IN}$.

In the event that diode 20 is damaged and becomes a short circuit between node 24 and the output of the boost converter 10, the turning on of the switching device 18 may cause a short circuit between capacitor 22, the damaged diode, and the switching device 18 to ground. If not corrected immediately, such a short circuit condition may result in a high current that may damage the switching device 18 and/or the capacitor 22. In this regard, a desaturation (DESAT) circuit (not shown in FIG. 1A-1D) may be employed to detect such a short circuit condition. For example, the DESAT circuit may be engaged when the switching device 18 is instructed to turn on. When the switching device 18 is once again switched back to the ON-state during the normal operation shown in FIG. 1C, and when the diode 20 is shorted, the DESAT circuit may detect the short circuit condition by a drain-to-source voltage measurement of the switching device 18 for example. In response to detecting a short circuit condition, the DESAT circuit may turn off the switching device 18 to protect the switching device 18 from being damaged by the high currents that would otherwise be induced by short circuit condition.

Although FIGS. 1A-1D illustrate a boost converter 10 as an example of a switch-mode power supply utilizing a switching device 18, the principles described herein regarding switching devices such as switching device 18 may also apply to other topologies, for example DC-DC topologies including buck converters, AC-DC topologies including flyback and/or forward converters, and/or DC-AC topologies including systems such as three-phase inverters and/or motor drivers. The principles described herein regarding switching devices, such as switching device 18, may also apply to other switched circuits, including for example solid-state circuit breakers. In a complex power system, such as an industrial or automotive motor drive system, the motor windings may sometimes short to each other or to ground from failure in isolation materials. As such, the short circuit protection may be required to avoid inverter damage in the motor. In this regard, it is desirable to turn-off the switching device, such as switching device 18, as soon the fault occurs. The inventor of embodiments of the present disclosure have recognized however that too quick of a response may also make the system susceptible to a false triggering condition that is also highly undesirable for power-critical systems like data centers, medical centers, and electric vehicle motor drives. By extending the short circuit withstand time (SCWT) of a switching device, such as switching device 18, the switching device may avoid an instant failure in the short circuit event and allow the DESAT circuit sufficient time to detect and react to the short circuit condition to therefore reduce likelihood of the false triggering condition.

The inventor of embodiments of the present disclosure have also recognized that prior techniques for extending the short circuit withstand time (SCWT) in a switching device, such as the switching device 18, have come at the expense of increased on-resistance RON, which may in turn cause increased conduction losses during operation, reducing efficiency of the power system and in some applications generating excess heat. Embodiments disclosed herein overcome these challenges by providing the dual advantages of extending short circuit withstand time while also reducing on-resistance of the power switching device.

Embodiments disclosed herein relate to a power switching device operable to reduce on-resistance and extend short circuit withstand time (SCWT). In some embodiments, the power switching device may include a cascode switching circuit wherein a normally-on transistor and a normally-off transistor are configured in a cascode topology. For the purposes of the present disclosure, a normally-on transistor may also be referred to as a depletion-mode transistor. In some embodiments, the normally-on transistor may be driven in an ON-state (also referred to as a conducting state) when the gate-to-source voltage is at zero volts, and may transition to an OFF-state when the gate-to-source voltage crosses and goes further negative below a negative gate-to-source threshold voltage. In some embodiments, such a negative gate-to-source threshold voltage may be for example −2 volts, −4 volts, −6 volts, −8 volts, or further negative depending on construction of the normally-on transistor. In some embodiments, the normally-on transistor may be a junction field effect transistor (JFET). The JFET may be a silicon carbide JFET formed for example on a silicon carbide substrate. The JFET may also be formed with any other semiconductor material, such as silicon (Si) or gallium nitride (GaN), suitable for use in power electronics for example. In other embodiments, the normally-on transistor may be for example a depletion mode MOSFET implemented with any suitable semiconductor material, such as silicon carbide (SiC), silicon (Si), or gallium nitride (GaN) for example.

For the purposes of the present disclosure, a normally-off transistor may also be referred to as an enhancement-mode transistor. In some embodiments, the normally-off transistor may be driven in an OFF-state (also referred to as a non-conducting state) when the gate-to-source voltage is at zero volts, and may transition to an ON-state when the gate-to-source voltage crosses above a positive gate-to-source voltage threshold. In some embodiments, such a positive gate-to-source voltage threshold may be for example +1 volt, +2 volts, +3 volts, +4 volts, +5 volts or more depending on construction of the normally-off transistor. In some embodiments, the normally-off transistor may be a metal-oxide semiconductor field-effect transistor (MOSFET). The MOSFET may be a silicon MOSFET formed for example on a silicon substrate. The MOSFET may also be formed with any other semiconductor material, such as silicon carbide (SiC) or gallium nitride (GaN), suitable for use in power electronics for example.

In embodiments disclosed herein, the gate-to-source voltage of the normally-on transistor may be positively biased to reduce on-resistance under normal operating conditions. The gate-to-source voltage of the normally-on transistor may also be negatively biased in response to a detected short circuit condition to extend the short circuit withstand time of the power switching device. As a result, the power switching device may achieve lower conduction loss and higher efficiency under the normal operating conditions and also extend the short circuit withstand time and thereby reduce false alarms under the short circuit conditions.

Figure 2:
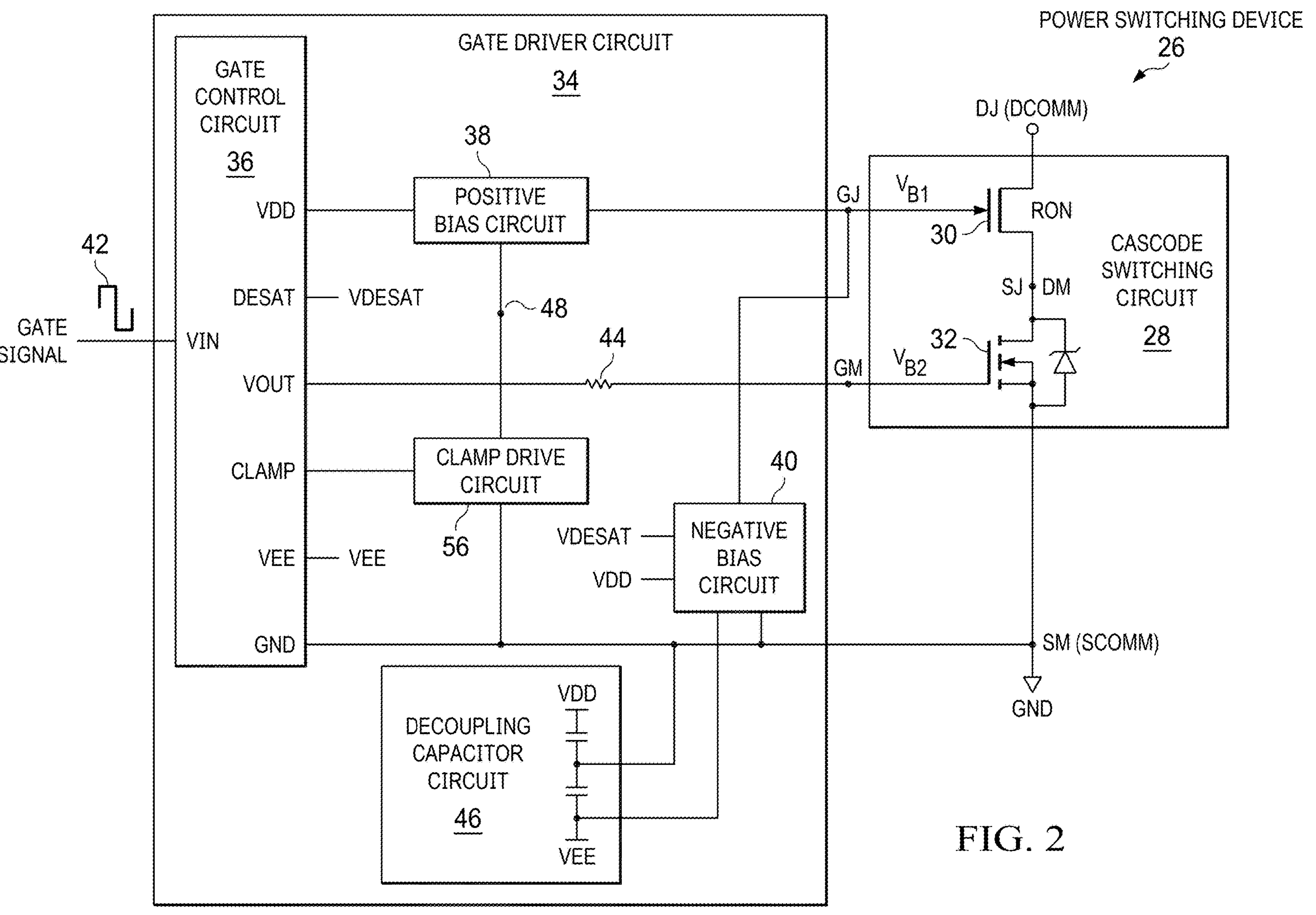
FIG. 2 is a schematic diagram of an power switching device in accordance with embodiments of the present disclosure.

FIG. 2 illustrates a schematic diagram of a power switching device 26 in accordance with embodiments of the present disclosure. The power switching device 26 may be implemented in any suitable fashion according to the operation described in the present disclosure. The power switching device 26 may represent an embodiment of the switching device 18 described above with reference to FIGS. 1A-1D. As described in detail below, the power switching device 26 can be configured to reduce an on-resistance RON of the cascode switching circuit 28 under a normal operating conditions (for example in the absence of a short circuit condition) and to also extend the short circuit withstand time (SCWT) under short circuit conditions. The power switching device 26 can reduce the on-resistance RON by 10%, for example, to thereby reduce the conduction loss and therefore increase the over current capability by 20%, for example, to thereby sustain a potential current surge under short circuit conditions.

As shown in FIG. 2, the power switching device 26 may include a gate driver circuit 34 and a cascode switching circuit 28. As described in further detail below, the gate driver circuit 34 may be configured to drive the transistors within the cascode switching circuit 28. The cascode switching circuit 28 may include a normally-on transistor 30 and a normally-off transistor 32. In some embodiments, the normally-on transistor 30 may be a normally-on silicon carbide (SiC) junction field-effect transistor (JFET) and the normally-off transistor 32 may be a normally-off silicon (Si) metal-oxide-semiconductor field-effect transistor (MOSFET).

The normally-on transistor 30 may include a respective drain terminal DJ, a respective gate terminal GJ, and a respective source terminal SJ. The normally-off transistor 32 may include a respective drain terminal DM, a respective gate terminal GM, and a respective source terminal SM. As shown in FIG. 2, the normally-on transistor 30 and the normally-off transistor 32 may be configured according to a cascode topology. For example, the respective drain terminal DJ of the normally-on transistor 30 may be coupled to a common drain terminal DCOMM of the cascode switching circuit 28, the respective source terminal SJ of the normally-on transistor 30 may be coupled to the respective drain terminal DM of the normally-off transistor 32, and the respective source terminal SM of the normally-off transistor 32 may be coupled to a common source terminal SCOMM of the cascode switching circuit 28. The common source terminal SCOMM may be coupled to a ground GND or in an electronic power system where the power switching device 26 is employed. In applications where the power switching device 26 is utilized for a low-side switch for example, the common source terminal SCOMM may be coupled to the ground line of the system. In other applications where the power switching device 26 is utilized for a high-side switch, for example, the common source terminal SCOMM may serve as a floating ground GND for the power switching device 26. In either such scenarios, reference herein to a coupling to ground GND may refer to a coupling to the common source terminal SCOMM which may either serve as a floating ground for the power switching device 26 or be coupled to the system ground.

The cascode switching circuit 28 may be turned on when the normally-on transistor 30 and the normally-off transistor 32 are both driven in an ON-state. As shown in FIG. 2, the normally-on transistor 30 may controlled by a first bias voltage $V_{B1}$ applied to the respective gate terminal GJ of the normally-on transistor 30. The normally-off transistor 32 may be controlled by a second bias voltage $V_{B2}$ applied to the respective gate terminal GM of the normally-off transistor 32.

To drive the cascode switching circuit 28 in an ON-state, the normally-off transistor 32 may first be driven in an ON-state. For example, gate control circuit 36 may drive the gate of the normally-off transistor via resistor 44 such that the second bias voltage $V_{B2}$ at the gate terminal GM of the normally-off transistor 32 (whose source terminal SM may be coupled to ground GND) is greater than a gate-to-source threshold (for example 5 volts) of the normally-off transistor 32. When the normally-off transistor 32 transitions to the ON-state, the voltage at the drain terminal DM of the normally-off transistor 32, which is coupled to the source terminal SJ of the normally-on transistor 30, may drop and approach ground GND. As described in further detail below with reference to FIG. 3, the positive bias circuit 38 may drive the gate terminal GJ of the normally-on transistor with a positive first bias voltage $V_{B1}$ during normal conditions. For example, positive bias circuit 38 may provide a positive bias voltage for the first bias voltage $V_{B1}$, where the positive bias voltage is greater than zero volts relative to a source terminal voltage of the normally-off transistor 32 (for example relative to 0 volts or ground GND). The gate-to-source voltage of the normally-on transistor 30 may therefore be greater than zero volts, and thus also greater than the negative gate-to-source threshold voltage of the normally-on transistor 30. As a result, the normally-on transistor 30 may also be in an ON-state in response to the normally-off transistor 32 being in an ON-state during normal operating conditions.

To drive the cascode switching circuit 28 in an OFF-state, the normally-off transistor 32 may first be driven in an OFF-state. For example, gate control circuit 36 may drive the gate of the normally-off transistor via resistor 44 such that the second bias voltage $V_{B2}$ at the gate terminal GM of the normally-off transistor 32 (whose source terminal SM may be coupled to ground GND) is less than a gate-to-source threshold (for example 5 volts) of the normally-off transistor 32. When the normally-off transistor 32 transitions from an ON-state to an OFF-state, the voltage at the drain terminal DM of the normally-off transistor 32 and at the source terminal SJ of the normally-on transistor 30, may begin to rise due to continued conduction through the normally-on transistor 30. When the voltage at the source terminal SJ of the normally-on transistor 30 reaches a voltage level relative to the first bias voltage $V_{B1}$ at the gate terminal GJ of the normally-on transistor 30 such that the gate-to-source voltage of normally-on transistor 30 reaches the negative gate-to-source threshold voltage, normally-on transistor may turn off. Normally-on transistor 30 may thus provide cascode protection to the normally-off transistor 32 by blocking the voltage at the drain terminal DM of the normally-off transistor 32 from continuing to rise toward the value of an external high voltage coupled to the common drain terminal DCOMM of the cascode switching circuit 28.

As shown in FIG. 2, gate driver circuit 34 may include gate control circuit 36, positive bias circuit 38, negative bias circuit 40, decoupling capacitor circuit 46, and clamp drive circuit 56. In some embodiments, the gate control circuit 36 may include at least a Vin terminal, a Vout terminal, a VDD terminal, a VEE terminal, a DESAT terminal, and a GND terminal.

The VDD terminal and VEE terminal of gate control circuit 36 may provide voltage supplies to other components of gate driver circuit 34. For example, the VDD terminal may be configured to output a positive supply voltage VDD (for example 15 V) from the gate control circuit 36, and may be coupled to the positive bias circuit 38, the negative bias circuit 40, and the decoupling capacitor circuit 46. The VEE terminal may be configured to output a negative supply voltage VEE (for example −3 volts to −4 volts) from the gate control circuit 36, and may be coupled to the decoupling capacitor circuit 46. The GND terminal of gate control circuit 36 may be coupled to the common source terminal SCOMM of the cascode switching circuit 28, which may in turn be coupled to the system ground GND. As shown in FIG. 2, the decoupling capacitor circuit 46 may include multiple capacitors respectively coupled to receive and store the positive supply voltage VDD and the negative supply voltage VEE. The decoupling capacitor circuit 46 may thus be configured to provide a positive supply voltage VDD and a negative supply voltage VEE to the negative bias circuit 40 as described in further detail below with reference to FIG. 4.

The Vin terminal, Vout terminal, and DESAT terminal of gate control circuit 36 may control the operation of how the cascode switching circuit 28 is driven. For example, the Vin terminal may be configured to receive a gate signal 42 for instructing whether to drive the cascode switching circuit 28 in an ON-state or an OFF-state. The Vout terminal may be coupled to the respective gate terminal GM of the normally-off transistor 32 via a resistor 44 and may be configured to provide the second bias voltage $V_{B2}$ for driving the normally-off transistor 32 in an ON-state or an OFF-state. For example, in response to repeated high and low states of the gate signal 42 received at the Vin terminal, the Vout terminal may drive the second bias voltage $V_{B2}$ at the gate terminal GM of the normally-off transistor 32 above and below the gate-to-source threshold of the normally-off transistor 32, thereby repeatedly switching on and off normally-off transistor 32.

The DESAT pin may be coupled to the negative bias circuit 40 and may be configured to generate a desaturation voltage VDESAT (for example 9 V) to activate the negative bias circuit 40 in response to a short circuit condition being detected. Such a short circuit condition may be detected by either the gate control circuit 36 or other circuitry external to the gate driver circuit 34. For example, in response to receiving the gate signal 42, the gate control circuit 36 may monitor the power switching device 26 to determine whether a short circuit condition is present. For example, although not shown in FIG. 2, gate control circuit 36 (or other external circuitry) may include a comparator for comparing the voltage at the common drain terminal DCOMM of the cascode switching circuit 28 against a threshold when the cascode switching circuit 28 is in an ON-state as instructed by the gate signal 42.

When no short circuit is detected, the gate control circuit 36 may conclude that power switching device 26 is operating under normal conditions. In response to no short circuit being detected, the desaturation voltage VDESAT may be removed and held at 0 volts, for example, to deactivate the negative bias circuit 40. During such normal operating conditions, and as described in further detail below with reference to FIG. 3, the positive bias circuit 38 may apply the first bias voltage $V_{B1}$ with a positive value (greater than 0 volts) at the gate terminal GJ of the normally-on transistor 30 to thereby reduce the on-resistance RON of the normally-on transistor 30. The internal operation of an example embodiment of positive bias circuit 38 is described in further detail below with reference to FIG. 3.

Figure 3:
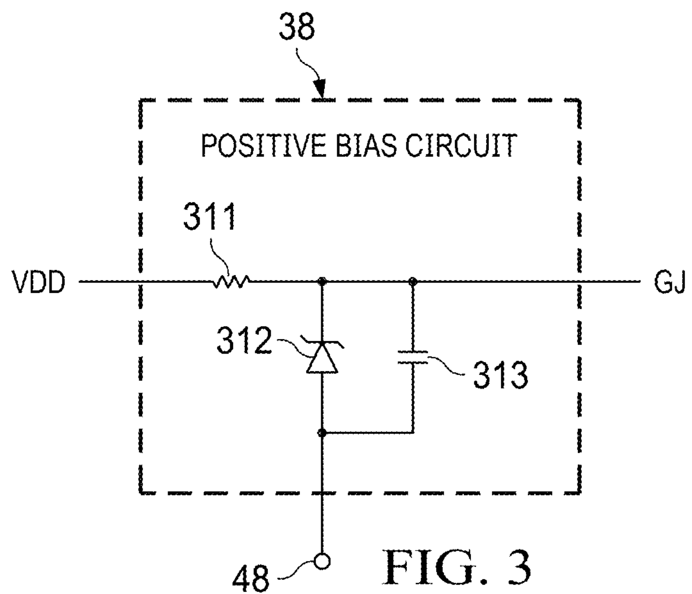
FIG. 3 is a schematic diagram of an positive bias circuit in accordance with embodiments of the present disclosure.

FIG. 3 is a schematic diagram of a positive bias circuit 38 in accordance with embodiments of the present disclosure. The positive bias circuit 38 may be implemented in any suitable fashion according to the operation described in the present disclosure. Although the example embodiment of the positive bias circuit 38 shown in FIG. 3 includes particular components arranged as described directly below, other embodiments of positive bias circuit 38 may utilize other circuit configurations to similarly provide a positive bias voltage.

In some embodiments, the positive bias circuit 38 may include a resistor 311, a diode 312, and a capacitor 313. As shown in FIG. 3, resistor 311 may be coupled in series between a VDD voltage supply line (from the gate control circuit 36) and the gate terminal GJ of normally-on transistor 30. In some embodiments, resistor 311 may have a resistance of several KΩ (for example 1, 2, 3, 5, 10, or more KΩ) and may thereby be configured to limit a current supply to maintain a lower power loss at the respective gate terminal GJ.

As also shown in FIG. 3, the diode 312 may be coupled between the coupling node 48 and the gate terminal GJ of the normally-on transistor 30. Referring back to FIG. 2, the coupling node 48 may couple positive bias circuit 38 to clamp drive circuit 56, which is described in further detail with reference to FIG. 5. Referring again to FIG. 3, the diode 312 may have an anode coupled to the coupling node 48 and an anode coupled to the gate terminal GJ of the normally-on transistor 30. In some embodiments, the diode 312 may be a Zener diode with a reverse breakdown voltage at or around 5 volts for example. The diode 312, in combination with the clamp drive circuit 56 shown in FIG. 5, may thus ensure that the first bias voltage $V_{B1}$ does not exceed 5 volts. The diode 312 may, for example, prevent the positive supply voltage VDD from driving the first bias voltage $V_{B1}$ higher than 5 volts at an initial startup of the power switching device 26. By limiting the first bias voltage $V_{B1}$ to no higher than 5 volts, for example, the diode 312 may limit the voltage required at the source terminal SJ of the normally-on transistor 30 to meet the negative gate-to-source threshold of the normally-on transistor 30 and thereby turn off the normally-on transistor 30.

The capacitor 313 may be coupled in parallel with the diode 312 between the coupling node 48 and the gate terminal GJ of the normally-on transistor 30. In some embodiments, capacitor 313 may be, for example, a 50 volt rated capacitor. The capacitor 313 may be configured to support a pulsing gate current during a switching transient (for example a turn-on transition and a turn-off transition) of the power switching device 26. Specifically, when the power switching device 26 transitions between the ON-state and the OFF-state, a parasitic capacitance between the gate terminal GJ and the drain terminal DJ, and a parasitic capacitance between the gate terminal GJ and the source terminal SJ, may be charged or discharged through the capacitor 313. Notably, the capacitor 313 not only stores and provides the positive first bias voltage $V_{B1}$ to help reduce the on-resistance RON, but also supplies a low impedance path to charge and discharge the parasitic gate-to-drain capacitance and the parasitic gate-to-source capacitance of the normally-on transistor 30. The capacitor 313 may have a sufficient capacitance value to support such charging and discharging of the parasitic gate-to-drain capacitance and the parasitic gate-to-source capacitance of the normally-on transistor 30. For example, depending on the size of normally-on transistor 30, and the resulting size of the parasitic gate-to-drain and gate-to-source capacitances of normally-on transistor 30, capacitor 313 may have a capacitance value of, 2 μF, 5 μF, 10 μF, 20 μF, 40 μF, 100 μF, or more.

The capacitor 313 may also be configured to help self-regulate the first bias voltage $V_{B1}$ to below 3.5 volts, for example, at or around 2.5 volts. In embodiments where the normally-on transistor 30 is a JFET transistor, and when the normally-on transistor 30 is in the ON-state, the positive first bias voltage $V_{B1}$ may forward bias a gate-source diode in the normally-on transistor 30 to draw a current from the capacitor 313. If the discharge of the capacitor 313 cannot be replenished by the next turn-off cycle of the normally-on transistor 30, the voltage across the capacitor 313 may droop until the discharge current through the forward biased gate-source diode matches the charge supplied by the positive supply voltage VDD through resistor 311.

With reference back to FIG. 2, the gate control circuit 36 may monitor for a short circuit condition in response to receiving a gate signal 42 instructing gate control circuit 36 to drive cascode switching circuit 28 in an ON-state. In the absence of a detected short circuit, the gate control circuit 36 may pull the DESAT terminal down to 0 volts or equal to ground GND. With the desaturation voltage VDESAT held at 0 volts in the absence of a short circuit condition, negative bias circuit 40 may be disabled and the first bias voltage $V_{B1}$ at the gate terminal GJ of the normally-on transistor 30 may be controlled by positive bias circuit 38 as described above.

Upon detecting a short circuit condition, the gate control circuit 36 may provide the desaturation voltage VDESAT (for example 9 volts) to negative bias circuit 40 via the DESAT terminal. The negative bias circuit 40, in turn, may be configured to drive the first bias voltage $V_{B1}$ as a negative bias voltage (for example between −3 V to −5 V) at the gate terminal GJ of the normally-on transistor 30. In some embodiments, the negative bias voltage may be between zero volts and the negative gate-to-source threshold of the normally-on transistor 30 so as to maintain the normally-on transistor 30 in an ON-state but with a higher on-resistance RON. The negative bias voltage may thus reduce current flow through the normally-on transistor 30 during the short circuit condition and may thereby extend the short circuit withstand time of the normally-on transistor 30. The internal operation of an example embodiment of negative bias circuit 40 is described in further detail below with reference to FIG. 4.

Figure 4:
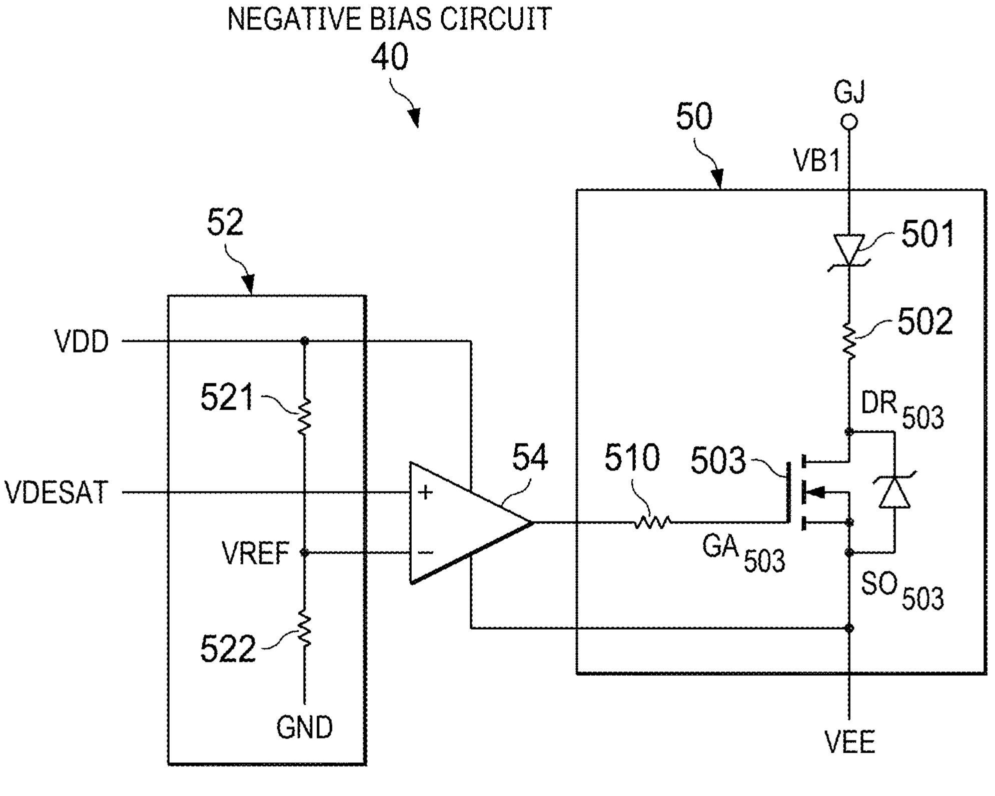
FIG. 4 is a schematic diagram of an negative bias circuit in accordance with embodiments of the present disclosure.

FIG. 4 is a schematic diagram of a negative bias circuit 40 in accordance with embodiments of the present disclosure. The negative bias circuit 40 may be implemented in any suitable fashion according to the operation described in the present disclosure. Although the example embodiment of the negative bias circuit 40 shown in FIG. 4 includes particular components arranged as described directly below, other embodiments of negative bias circuit 40 may utilize other circuit configurations to similarly provide a negative bias voltage.

In some embodiments, the negative bias circuit 40 may include a gate driver 50, a voltage divider 52, and an op-amp 54. The gate driver 50 may be coupled between the negative voltage rail VEE provided by decoupling capacitor circuit 46 and the respective gate terminal GJ of the normally-on transistor 30. In some embodiments, the gate driver 50 may include a diode 501, a resistor 502, and a transistor 503. In some embodiments, the diode 501 may be for example a Zener diode with a voltage rating at or around 20 volts to 30 volts. The resistor 502 may have a low resistance value such as 2 ohms, 1 ohms, or less. In some embodiments, a resistance value of 0 ohms may be selected for the resistor 502, making the resistor 502 effectively a short circuit. Further, in some embodiments, transistor 503 may be for example a MOSFET transistor, such as an NMOS or a PMOS type transistor. As shown in FIG. 4, the diode 501 and the resistor 502 may be coupled in series between the respective gate terminal GJ and a drain electrode DR 503 of the transistor 503. A source electrode $SO_{503}$ of the transistor 503 may be coupled to the decoupling capacitor circuit 46 in FIG. 2 to receive the negative supply voltage VEE. Further, a gate electrode $GA_{503}$ of the transistor 503 may be coupled to output of the op-amp 54 via a resistor 510. When the transistor 503 is turned on by the op-amp 54 (also referred to herein as operational amplifier 54), the first bias voltage $V_{B1}$ at the respective gate terminal GJ may be pulled down to the negative supply voltage VEE, thus decreasing a saturation current in the normally-on transistor 30 shown in FIG. 2. Accordingly, the short circuit withstand time of the normally-on transistor 30 and of cascode switching circuit 28 as a whole may thereby be extended under the control of the negative bias circuit 40.

The level of negative bias (JFET channel impedance or JFET saturation current) is controlled by VEE in reference to GND. A more negative VEE may provide a higher JFET channel impedance and lower JFET saturation current so that the short circuit withstand time is also longer. In some embodiments, the negative supply voltage VEE may be less than zero volts and may approach but not cross the negative gate-to-source threshold of the normally-on transistor 30. Accordingly, the normally-on transistor 30 may continue to conduct in an ON-state when the first bias voltage $V_{B1}$ at the gate terminal GJ of the normally-on transistor 30 is set to VEE, but may continue to conduct with a higher JFET channel impedance and lower JFET saturation current in order to extend the short circuit withstand time.

Referring back to FIG. 4, the voltage divider 52 may be configured to derive a reference voltage VREF from the positive supply voltage VDD. For example, the voltage divider 52 may be coupled between the VDD terminal and ground GND. The voltage divider 52 may include a pair of resistors 521 and 522 that may divide the positive supply voltage VDD to thereby generate the reference voltage VREF. The op-amp 54 may compare the desaturation voltage VDESAT against the reference voltage VREF to determine when to turn on the transistor 503 in the gate driver 50. Specifically, the op-amp 54 may output the positive supply voltage VDD to turn on the transistor 503 when the desaturation voltage VDESAT is higher than the reference voltage VREF. In contrast, when the desaturation voltage VDESAT is lower than the reference voltage VREF, the op-amp 54 may output the negative supply voltage VEE to the gate electrode $GA_{503}$ to thereby turn off the transistor 503. When transistor 503 is driven in an OFF-state, the negative bias circuit 40 may have no impact on the normally-on transistor 30. Specifically, when transistor 503 is driven in an OFF-state, the negative bias circuit 40 may exercise no control over the first bias voltage $V_{B1}$, which may instead be controlled by positive bias circuit 38 as described above with reference to FIG. 2 and FIG. 3. Because the negative bias circuit 40 may determine when to apply the negative first bias voltage $V_{B1}$ based on the reference voltage VREF, and because the reference voltage VREF is determined by the resistors 521 and 522, the negative bias circuit 40 can thus be programmed for when to generate the negative first bias voltage $V_{B1}$ by setting the resistors 521 and 522 to appropriate resistance values.

In some embodiments, when a short circuit condition is detected, it may be possible to turn on the transistor 503 before the desaturation voltage VDESAT reaches its full strength (for example at 9 volts) such that the power switching device 26 can react to the short circuit condition quicker (for example, in the first 1 to 3 μs). As an example, if the desaturation voltage VDESAT takes 6 μs to reach the 9 volt peak, the reference voltage VREF may then be set at 3 volts by the selection of resistors 521 and 522 such that the transistor 503 can be turned on at 2 μs to thereby negatively bias the normally-on transistor 30 and to thereby extend the short circuit withstand time of the normally-on transistor 30. Therefore, the system as a whole may have more time to ensure that the short circuit event is not a false alarm and react appropriately.

Referring back to FIG. 2, the power switching device 26 may further include a clamp drive circuit 56. The clamp drive circuit 56 may be coupled between the coupling node 48 in the positive bias circuit 38 and the common source terminal SCOMM. In some embodiments, the clamp drive circuit 56 may be configured to receive a clamp signal from the clamp terminal of gate control circuit 36, and may be configured to reduce reverse recovery loss of the cascode switching circuit 28 according to the clamp signal. The internal operation of an example embodiment of clamp drive circuit 56 is described in further detail below with reference to FIG. 5.

Figure 5:
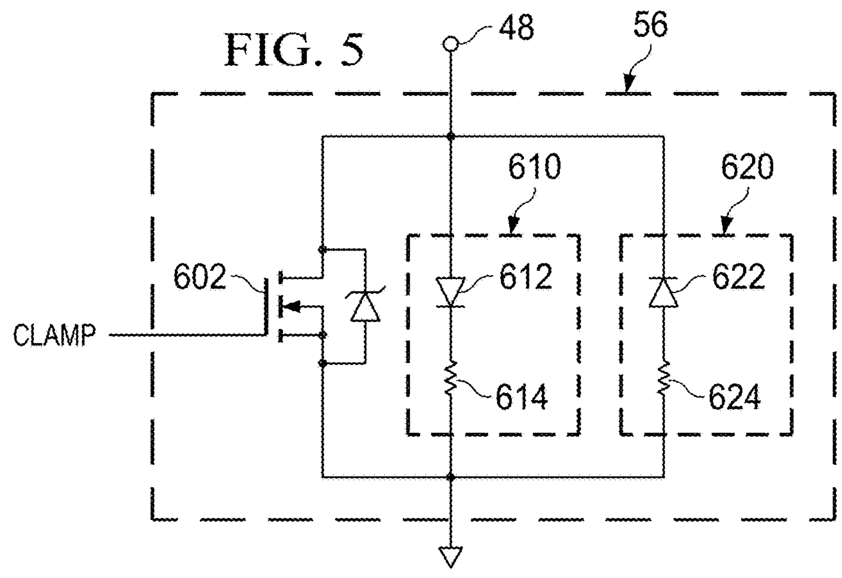
FIG. 5 is a schematic diagram of an clamp drive circuit in accordance with embodiments of the present disclosure.

FIG. 5 is a schematic diagram of a clamp drive circuit 56 in accordance with embodiments of the present disclosure. The clamp drive circuit 56 may be implemented in any suitable fashion according to the operation described in the present disclosure. Although the example embodiment of the clamp drive circuit 56 shown in FIG. 5 includes particular components arranged as described directly below, other embodiments of clamp drive circuit 56 may utilize other circuit configurations to provide similar operation.

In some embodiments, the clamp drive circuit 56 may include a clamp switch 602, a turn-off control circuit 610, and a turn-on control circuit 620. The clamp switch 602, the turn-off control circuit 610, and the turn-on control circuit 620 may control how fast the cascode switching circuit 28 is turned on and turned off. When the clamp switch 602 is turned off, the speed with which the cascode switching circuit 28 is turned off may be determined by the charging rate through the turn-off control circuit 610. In this state, the turn-off speed of the cascode switching circuit 28 may be at its slowest. Further, when the clamp switch 602 is turned off, the speed with which the cascode switching circuit 28 is turned on may be determined by the charging rate through the turn-on control circuit 620. In this state, the turn-on speed of the cascode switching circuit 28 may be at its slowest.

The turn-on control circuit 620 may be coupled in series between the coupling node 48 and ground GND. The turn-on control circuit 620 may be configured to allow charge to flow from ground GND to the coupling node 48 (and thus to the gate terminal of the normally-on transistor 30) so as to control how fast the cascode switching circuit 28 may be turned on. In some embodiments, the turn-on control circuit 620 may include for example a diode 622 and a resistor 624 coupled in series. As shown in FIG. 5, the diode 622 may have a cathode coupled to and/or pointed toward coupling node 48 in order to allow charge to flow from ground GND to the coupling node 48 (and thus to the gate terminal GJ of the normally-on transistor 30). The resistance value of resistor 624 may control how fast the cascode switching circuit 28 may be turned on. For example, a higher resistance may provide for a slower turn-on transition, and a lower resistance may provide for a faster turn-on transition.

The turn-off control circuit 610 may be coupled in series between the coupling node 48 and ground GND. The turn-off control circuit 610 may be configured to allow charge to flow from the coupling node 48 (and from the gate terminal GJ of the normally-on transistor 30) to ground GND so as to control how fast the cascode switching circuit 28 may be turned off. In some embodiments, the turn-off control circuit 610 may include for example a diode 612 and a resistor 614 coupled in series. As shown in FIG. 5, the diode 612 may have a cathode coupled to and/or pointed toward ground GND in order to allow charge to flow to ground GND from the coupling node 48 (and thus from the gate terminal GJ of the normally-on transistor 30). The resistance value of resistor 614 may control how fast the cascode switching circuit 28 may be turned off. For example, a higher resistance may provide for a slower turn-off transition, and a lower resistance may provide for a faster turn-off transition. In some embodiments, resistor 614 and resistor 624 may have the same resistance value. In other embodiments, resistor 614 may have a greater or a lesser resistance value than resistor 624 in order to provide for a slower or faster turn-off transition relative to the turn-on transition.

As shown in FIG. 5, the clamp switch 602 may also be coupled between the coupling node 48 and ground GND. The clamp switch 602 may receive a clamp drive signal CLAMP from the gate control circuit 36. The clamp switch 602 may be turned off in response to the clamp drive signal CLAMP being in a low voltage state, for example, at a voltage below the gate threshold of the MOSFET transistor forming clamp switch 602. When the clamp switch 602 is turned off, charge is blocked from flowing between the coupling node 48 and ground GND through the clamp switch 602. The clamp switch 602 may also be turned on in response to the clamp drive signal CLAMP being in a high voltage state, for example, at a voltage above the gate threshold of the MOSFET transistor forming clamp switch 602. When the clamp switch 602 is turned on, charge is allowed to flow between the coupling node 48 and ground GND through the clamp switch 602.

When the clamp switch 602 is turned on, the turn-on control circuit 620 and the turn-off control circuit 610 may be bypassed by the clamp switch 602. In the example embodiment shown in FIG. 5, both the turn-on control circuit 620 and the turn-off control circuit 610 may be bypassed in response to the clamp drive signal CLAMP driving the clamp switch 602 in an ON-state. Specifically, when the clamp switch 602 is turned on, the turn off speed and the turn on speed of the cascode switching circuit 28 of power switching device 26 may at its fastest. As such, the turn on speed and the turn off speed of the cascode switching circuit 28, and of power switching device 26 as a whole, may be controlled by controlling when the clamp switch 602 is turned on and turned off. In some embodiments, the clamp switch 602 may be turned on to improve the reverse recovery time of the normally-on transistor 30 when power switching device 26 is transitioning out of a third quadrant (freewheeling diode mode). For example, when power switching device 26 is transitioning from a freewheeling diode mode to a fully non-conducting mode, the clamp switch 602 may be turned on to improve the speed with which the normally-on transistor 30 may turn off. The reverse recovery time may thus be improved.

Referring back to FIG. 2, the gate-to-source voltage of the normally-on transistor 30 may be positively biased by positive bias circuit 38 to reduce on-resistance under normal operating conditions. The gate-to-source voltage of the normally-on transistor 30 may also be negatively biased by negative bias circuit 40 in response to a detected short circuit condition to extend the short circuit withstand time of the power switching device. As a result, the power switching device 26 may achieve lower conduction loss and higher efficiency under the normal operating conditions and also extend the short circuit withstand time.

Figure 6A:
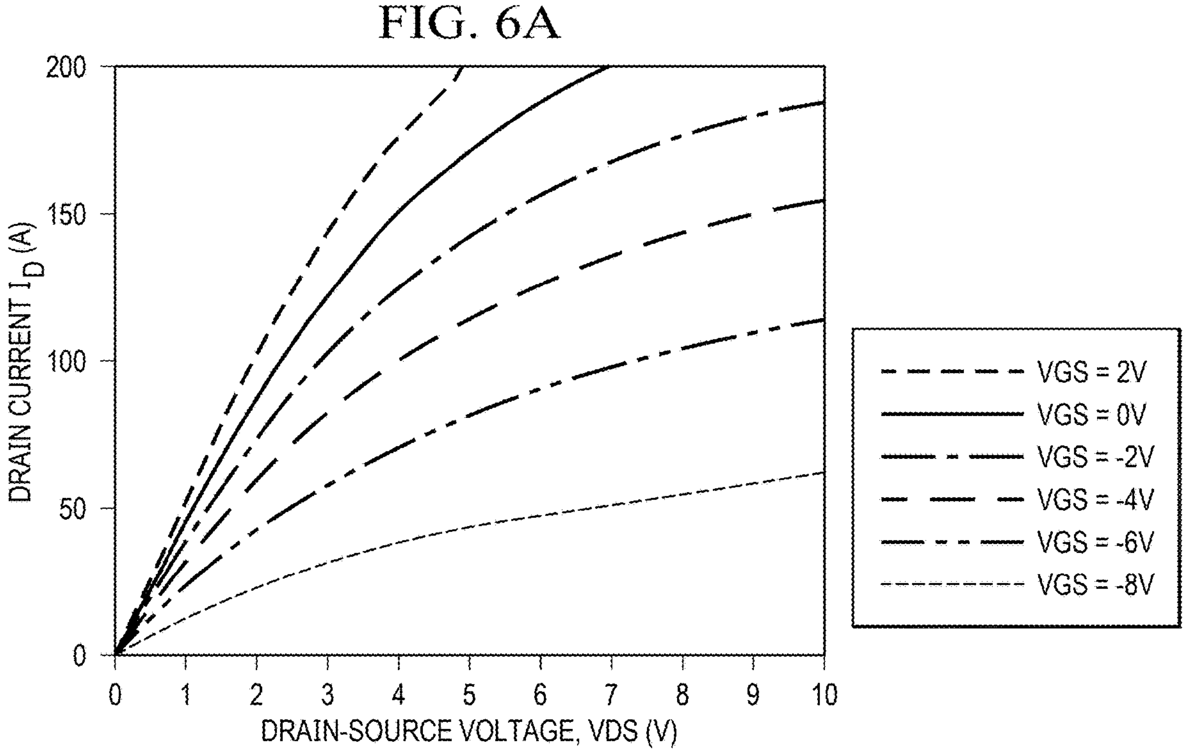
FIGS. 6A and 6B are graphic diagrams illustrating characteristics of a semiconductor transistor in accordance with embodiments of the present disclosure.
Figure 6B:
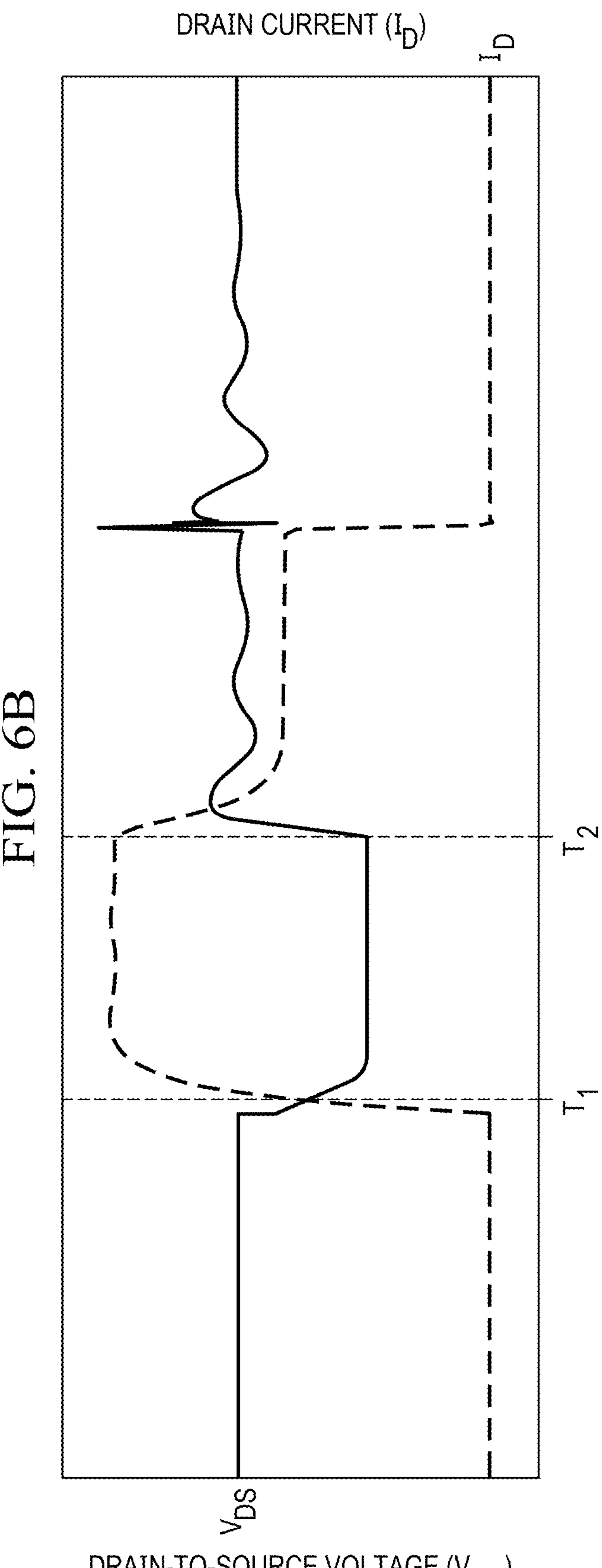

FIGS. 6A and 6B are graphic diagrams illustrating characteristics of a semiconductor transistor in accordance with embodiments of the present disclosure. FIG. 6A illustrates the drain current as a function of the drain-to-source voltage for different gate-to-source voltages (Vgs) of a normally-on transistor, such as normally-on transistor 30. As shown in FIG. 3A, when the gate-to-source voltage (Vgs) increases, the drain current for a given drain-to-source voltage tends to increase as a result of a reduction of the on-resistance RON of the transistor. Thus, as described above with reference to FIG. 2, the on-resistance RON of the normally-on transistor 30 may be reduced during normal operation by positively biasing the voltage applied to the gate of normally-on transistor 30 above zero volts during normal operating conditions. Such reduction of on-resistance RON may in turn reduce conduction losses in power switching device 26, thereby increasing the efficiency of the power system in which power switching device 26 is implemented.

FIG. 6B illustrates the drain current of the normally-on transistor over time as a short-circuit condition is incurred. Specifically, FIG. 6B illustrates the drain current ID and the drain voltage VD of a normally-on transistor 30 in a cascode switching circuit 28 of a low-side power switching device included within an H-bridge as a short circuit condition is incurred. Prior to time T1, the high-side power switching device of the H-bridge may be turned on and the low-side power switching device may be turned off. At time T1, a short circuit condition may be incurred whereby the low-side power switching device turns on in addition to the high-side power switching device. As shown in FIG. 6B, the drain current of the normally-on transistor 30 may increase substantially at time T1, due to the occurrence of the short circuit condition. Thereafter, at time T2, a negative bias voltage may be applied to the gate terminal GJ of the normally-on transistor 30 in cascode switching circuit 28 of the low-side power switching device. The drain current may thus begin to decline at time T2 as a result of increased on-resistance RON in the normally-on transistor. By increasing the on-resistance RON to reduce the drain current under the short circuit condition, the normally-on transistor 30 may be able to withstand the short circuit condition longer, thus extending the SCWT of the normally-on transistor and of cascode switching circuit 28 as a whole.

Figure 7:
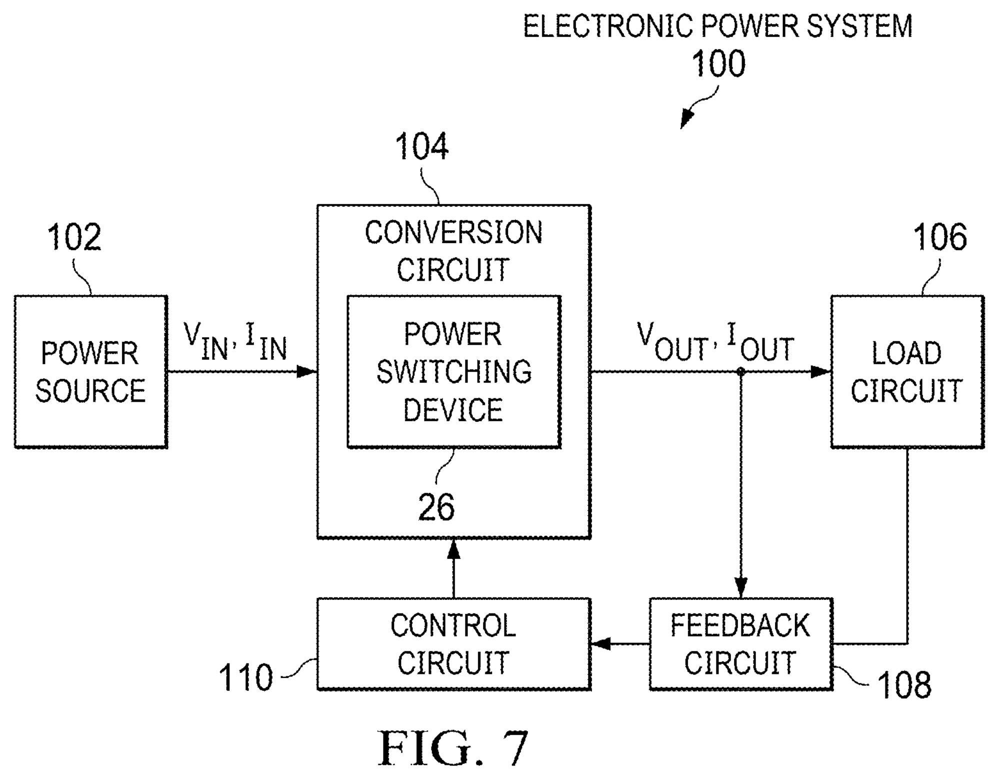
FIG. 7 is a schematic diagram of an electronic power system in accordance with embodiments of the present disclosure.

The power switching device 26 of FIG. 2 can be provided in an electronic power system to perform the functionalities described herein. In this regard, FIG. 7 is a schematic diagram of an electronic power system 100. As shown in FIG. 7, the power switching device 26 of FIG. 2 may be utilized within electronic power system 100.

In some embodiments, the electronic power system 100 may include a power source 102, a conversion circuit 104, a load circuit 106, a feedback circuit 108, and a control circuit 110. The power source 102, which may be an AC or a DC power source, may be configured to generate an input voltage $V_{IN}$ and/or an input current $I_{IN}$.

The conversion circuit 104 may be configured to convert the input voltage $V_{IN}$ and/or the input current $I_{IN}$ into a desired output voltage $V_{OUT}$ and/or an output current $I_{OUT}$ to meet the requirement of the load circuit 106. For example, in some embodiments, the conversion circuit 104 may be a step-down converter that converts a higher input voltage $V_{IN}$ and/or a lower input current $I_{IN}$ to a lower output voltage $V_{OUT}$ and/or a higher output current $I_{OUT}$. In other embodiments, the conversion circuit 104 may be a step-up converter that converts a lower input voltage $V_{IN}$ and/or a higher input current $I_{IN}$ to a higher output voltage $V_{OUT}$ and/or a lower output current $I_{OUT}$. The conversion circuit 104 may also be a step-down and step-up converter that can toggle between step-down and step-up operations in accordance with a duty cycle to produce the output voltage $V_{OUT}$ and/or the output current $I_{OUT}$ at a desired level. The conversion circuit 104 may also be a rectifier or inverter. Such a rectifier may convert an AC input source into a DC output to supply a DC voltage to DC loads. Such an inverter may convert a DC input source into an AC output to supply an AC voltage to AC loads.

The load circuit 106 may be any type of electrical circuit, such as an electric vehicle (EV) motor, EV battery, power grid, data center server, or other electrical load. The conversion circuit 104 may be configured to provide the output voltage $V_{OUT}$ and/or the output current $I_{OUT}$ to the load circuit 106 via any suitable transmission medium.

The feedback circuit 108 may be configured to provide various feedback signals to the control circuit 110. As an example, the feedback circuit 108 may dynamically measure the output voltage $V_{OUT}$ and/or the output current $I_{OUT}$ received by the load circuit 106 and report the measurement results to the control circuit 110, either in real time or with hysteresis. The feedback circuit 108 may also monitor operating conditions (for example, load impedance, operating frequency, and/or thermal temperature) in the load circuit 106 or the conversion circuit 104 and report such conditions to the control circuit 110. The control circuit 110, in turn, may dynamically control the conversion circuit 104 to adjust the output voltage $V_{OUT}$ and/or the output current $I_{OUT}$ based on the various feedback provided by the feedback circuit 108.

In some embodiments, the power switching device 26 may be provided in the conversion circuit 104. It should be appreciated that the power switching device 26 may also be provided in any other circuits in the electronic power system 100.

Figure 8:
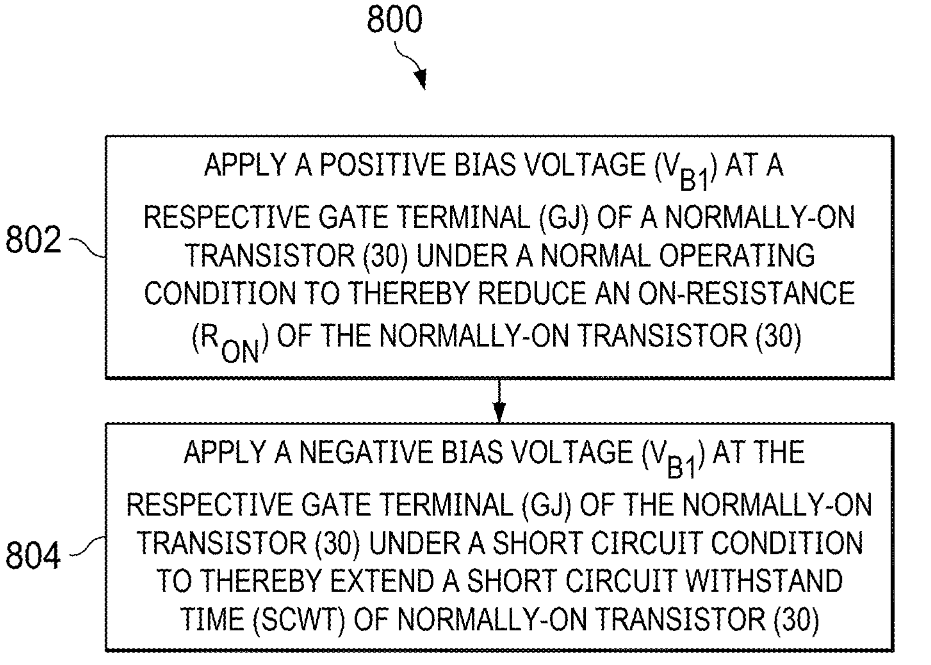
FIG. 8 illustrates a method for operating a power switching device in accordance with embodiments of the present disclosure.

FIG. 8 illustrates a method 800 for operating power switching device 26 in accordance with embodiments of the present disclosure. Method 800 may be performed by any suitable mechanism, including for example gate driver circuit 34, positive bias circuit 38, negative bias circuit 40, and/or decoupling capacitor circuit 46, or any suitable combination thereof. Method 800 may be performed with fewer or more steps than shown in FIG. 8. Moreover, the steps of method 800 may be repeated or performed recursively.

At step 802, method 800 may include applying the positive bias voltage $V_{B1}$ at the respective gate terminal GJ of the normally-on transistor 30 under the normal operating condition to thereby reduce the on-resistance RON of the normally-on transistor 30. For example, as described above with reference to FIG. 2 and FIG. 3, positive bias circuit 38 may apply a positive bias voltage $V_{B1}$ at a positive voltage level above zero volts to the respective gate terminal GJ of the normally-on transistor 30 under normal operating conditions.

At step 804, method 800 may include applying the negative bias voltage $V_{B1}$ at the respective gate terminal GJ of the normally-on transistor 30 under the short circuit condition to thereby extend the short circuit withstand time of the normally-on transistor 30. For example, as described above with reference to FIG. 2 and FIG. 3, negative bias circuit 40 may apply a negative bias voltage $V_{B1}$ to the respective gate terminal GJ of the normally-on transistor 30 in response to a detected short circuit condition. In some embodiments, the negative bias voltage may be between zero volts and the negative gate-to-source threshold of the normally-on transistor 30 so as to maintain the normally-on transistor 30 in an ON-state but with a higher on-resistance RON.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

What is claimed is:

1. A power switching device comprising:
- a cascode switching circuit comprising a normally-on transistor and a normally-off transistor provided in a cascode topology; and
- a gate driver circuit configured to:
  - apply a positive bias voltage at a respective gate terminal of the normally-on transistor under a normal operating condition; and
  - apply a negative bias voltage at the respective gate terminal of the normally-on transistor under a short circuit condition.

2. The power switching device of claim 1, wherein the positive bias voltage is greater than zero volts relative to a source terminal voltage of the normally-off transistor.

3. The power switching device of claim 1, wherein the negative bias voltage is between zero volts and a negative gate-to-source threshold of the normally-on transistor.

4. The power switching device of claim 1, wherein the gate driver circuit comprises:
- a positive bias circuit configured to apply the positive bias voltage at the respective gate terminal of the normally-on transistor under the normal operating condition;
- a negative bias circuit configured to apply the negative bias voltage at the respective gate terminal of the normally-on transistor under the short circuit condition; and
- a gate control circuit configured to:
  - generate a desaturation voltage in response to detecting the short circuit condition and to thereby cause the negative bias circuit to apply the negative bias voltage at the respective gate terminal of the normally-on transistor; and
  - remove the desaturation voltage under the normal operating condition to disable the negative bias circuit.

5. The power switching device of claim 4, further comprising a decoupling capacitor circuit configured to provide a positive supply voltage and a negative supply voltage to the negative bias circuit.

6. The power switching device of claim 4, wherein the negative bias circuit comprises:
- a voltage divider configured to derive a reference voltage from a positive supply voltage; and
- an op-amp configured to compare the reference voltage to the desaturation voltage to determine when to apply the negative bias voltage.

7. The power switching device of claim 1, wherein:
- the normally-on transistor comprises:
  - a respective drain terminal coupled to a common drain terminal of the cascode switching circuit; and
  - a respective source terminal; and
- the normally-off transistor comprises:
  - a respective drain terminal coupled to the respective source terminal of the normally-on transistor; and
  - a respective source terminal coupled to a common source terminal of the cascode switching circuit.

8. The power switching device of claim 1, wherein:
- the normally-on transistor is a normally-on silicon carbide (SiC) junction field-effect transistor (JFET); and
- the normally-off transistor is a normally-off silicon (Si) metal-oxide-semiconductor field-effect transistor (MOSFET).

9. An electronic power system comprising a conversion circuit coupled between a power source and a load circuit, the conversion circuit including a power switching device comprising:
- a cascode switching circuit comprising a normally-on transistor and a normally-off transistor provided in a cascode topology; and
- a gate driver circuit configured to:
  - apply a positive bias voltage at a respective gate terminal of the normally-on transistor under a normal operating condition; and
  - apply a negative bias voltage at the respective gate terminal of the normally-on transistor under a short circuit condition.

10. The electronic power system of claim 9, wherein the positive bias voltage is greater than zero volts relative to a source terminal voltage of the normally-off transistor.

11. The electronic power system of claim 9, wherein the negative bias voltage is between zero volts and a negative gate-to-source threshold of the normally-on transistor.

12. The electronic power system of claim 9, wherein the gate driver circuit comprises:
- a positive bias circuit configured to apply the positive bias voltage at the respective gate terminal of the normally-on transistor under the normal operating condition;
- a negative bias circuit configured to apply the negative bias voltage at the respective gate terminal of the normally-on transistor under the short circuit condition; and
- a gate control circuit configured to:
  - generate a desaturation voltage in response to detecting the short circuit condition to thereby cause the negative bias circuit to apply the negative bias voltage at the respective gate terminal of the normally-on transistor; and
  - remove the desaturation voltage under the normal operating condition.

13. The electronic power system of claim 12, wherein the power switching device further comprises a decoupling capacitor circuit configured to provide a positive supply voltage and a negative supply voltage to the negative bias circuit.

14. The electronic power system of claim 12, wherein the negative bias circuit comprises:
- a voltage divider configured to derive a reference voltage from a positive supply voltage; and
- an op-amp configured to compare the reference voltage to the desaturation voltage to determine when to apply the negative bias voltage.

15. The electronic power system of claim 9, wherein:
- the normally-on transistor comprises:
  - a respective drain terminal coupled to a common drain terminal of the cascode switching circuit; and
  - a respective source terminal; and
- the normally-off transistor comprises:
  - a respective drain terminal coupled to the respective source terminal of the normally-on transistor; and
- a respective source terminal coupled to a common source terminal of the cascode switching circuit.

16. The electronic power system of claim 9, wherein:
- the normally-on transistor is a normally-on silicon carbide (SiC) junction field-effect transistor (JFET); and
- the normally-off transistor is a normally-off silicon (Si) metal-oxide-semiconductor field-effect transistor (MOSFET).

17. A method for operating a power switching device comprising a normally-on transistor and a normally-off transistor configured in a cascode topology:

applying a positive bias voltage at a respective gate terminal of the normally-on transistor under a normal operating condition; and applying a negative bias voltage at the respective gate terminal of the normally-on transistor under a short circuit condition.

18. The method of claim 17, wherein the positive bias voltage is greater than zero volts relative to a source terminal voltage of the normally-off transistor.

19. The method of claim 17, wherein the negative bias voltage is between zero volts and a negative gate-to-source threshold of the normally-on transistor.

20. The method of claim 17, wherein:

the normally-on transistor is a normally-on silicon carbide (SiC) junction field-effect transistor (JFET); and the normally-off transistor is a normally-off silicon (Si) metal-oxide-semiconductor field-effect transistor (MOSFET).

* * * * *